(12) United States Patent
Van Houdt

(10) Patent No.: US 12,041,782 B2
(45) Date of Patent: Jul. 16, 2024

(54) MEMORY DEVICE WITH FERROELECTRIC CHARGE TRAPPING LAYER

(71) Applicant: IMEC VZW, Leuven (BE)

(72) Inventor: Jan Van Houdt, Bekkevoort (BE)

(73) Assignee: IMEC VZW, Leuven (BE)

( * ) Notice: Subject to any disclaimer, the term of this patent is extended or adjusted under 35 U.S.C. 154(b) by 1 day.

(21) Appl. No.: 17/817,550

(22) Filed: Aug. 4, 2022

(65) Prior Publication Data

US 2023/0262990 A1 Aug. 17, 2023

(30) Foreign Application Priority Data

Aug. 11, 2021 (EP) ..................................... 21190723

(51) Int. Cl.
*H10B 51/30* (2023.01)
*G11C 11/22* (2006.01)
*H10B 51/20* (2023.01)

(52) U.S. Cl.
CPC ............ *H10B 51/30* (2023.02); *G11C 11/223* (2013.01); *G11C 11/2275* (2013.01); *H10B 51/20* (2023.02)

(58) Field of Classification Search
USPC ........................................................ 365/145
See application file for complete search history.

(56) References Cited

U.S. PATENT DOCUMENTS

| | | | |
|---|---|---|---|
| 6,207,506 B1 * | 3/2001 | Yi ..................... | H01L 29/40117 257/E21.21 |
| 10,522,624 B2 | 12/2019 | Van Houdt | |
| 11,515,330 B2 * | 11/2022 | Chen ................. | H01L 29/78391 |
| 2004/0041186 A1 * | 3/2004 | Dimmler ............. | H01L 29/792 257/E21.208 |
| 2006/0038242 A1 * | 2/2006 | Hsu ..................... | H01L 29/516 257/407 |
| 2007/0190721 A1 * | 8/2007 | Cha ..................... | H01L 29/792 438/257 |
| 2010/0117141 A1 * | 5/2010 | Shin .................. | H01L 29/66833 257/326 |
| 2016/0012896 A1 * | 1/2016 | Li ....................... | G11C 11/2259 365/185.18 |
| 2016/0308070 A1 * | 10/2016 | Chang ................ | H10B 51/30 |
| 2018/0308537 A1 | 10/2018 | Karda et al. | |

(Continued)

OTHER PUBLICATIONS

Extended European Search Report issued in European Patent Application No. 21190723.3 issued Feb. 3, 2022.

(Continued)

*Primary Examiner* — Tan T. Nguyen
(74) *Attorney, Agent, or Firm* — Knobbe, Martens, Olson & Bear, LLP

(57) ABSTRACT

The present disclosure relates to memory devices, in particular, flash memory devices, storage class memory (SCM) devices or dynamic random access memory (DRAM) devices. The disclosure provides a memory device with a ferroelectric trapping layer. In particular, a memory cell for the memory device comprises a layer stack including: a semiconductor layer; a tunnel layer provided directly on the semiconductor layer; a ferroelectric trapping layer provided directly on the tunnel layer; and a conductive gate layer provided directly on the ferroelectric trapping layer. A blocking layer between the ferroelectric trapping layer and the gate layer may be omitted.

18 Claims, 5 Drawing Sheets

(56) References Cited

U.S. PATENT DOCUMENTS

2019/0057860 A1    2/2019  Yoon et al.
2021/0028180 A1    1/2021  Yamaguchi
2022/0238551 A1*   7/2022  Petti .................... H10B 43/40
2022/0406796 A1*  12/2022  Seki ..................... H10B 43/20

OTHER PUBLICATIONS

Fan, Chia-Chi, et al., "Impact of Ferroelectric Domain Switching in Nonvolatile Charge-Trapping Memory", IEEE Electron Devices Technology and Manufacturing Conference (EDTM). IEEE (2017) (pp. 224-225).

Ji, Hao, et al., "Improvement of Charge Injection Using Ferroelectric Si:HfO2 As Blocking Layer in MONOS Charge Trapping Memory," IEEE Journal of the Electron Devices Society 6 (2017) (pp. 121-125).

\* cited by examiner

MEMORY DEVICE WITH FERROELECTRIC CHARGE TRAPPING LAYER

CROSS-REFERENCE TO RELATED APPLICATIONS

This application claims foreign priority to European Application No. 21190723.3, filed Aug. 11, 2021, the content of which is incorporated by reference herein in its entirety.

BACKGROUND

Field

The present disclosure relates to memory devices, in particular, to flash memory devices, storage class memory (SCM) devices, and dynamic random access memory (DRAM) devices. The disclosure provides a memory device with at least one memory cell that includes a ferroelectric charge trapping layer. Further, the memory cell does not include a blocking layer between the ferroelectric charge trapping layer and a gate layer.

Description of the Related Technology

Conventional flash memories, in particular of the charge trapping type, rely on the tunneling of electrons for programming and erasing a memory cell, respectively (e.g., in a NAND type memory device).

FIGS. 1A and 1B show band-diagrams of an exemplary memory cell 10 of such a conventional Flash memory. The memory cell 10 includes a semiconductor layer 11 (typically silicon), a tunnel layer 12 (typically silicon oxide), a charge trapping layer 13 (typically silicon nitride), a blocking layer 14 (typically silicon oxide), and a metal gate 15.

FIG. 1A shows that at a beginning of a voltage pulse for programming the memory cell 10, a high number of electrons are injected from the semiconductor layer 11 into the charge trapping layer 13 by tunneling through the tunnel layer 12. The charge trapping layer 13 comprises traps, which are suitable for capturing electrons. The electric field in the charge trapping layer 13 during programming pushes electrons away from the interface between the charge trapping layer 13 and the tunnel layer 12.

FIG. 1B shows further that at the end of the programming pulse, the electron injection is lower, and electrons are now trapped in the charge trapping layer 13. The trapped electrons cause a band bending in the charge trapping layer 13, which increases the force on the electrons away from the trapping sites towards the gate 15. Therefore, the blocking layer 14 is required for a sufficient retention time of the memory cell 10. However, also the tunnel layer 12 is needed to prevent electrons from escaping towards the semiconductor layer 11, and to thus guarantee the retention time.

Such a conventional flash memory suffers from a very high programming/erasing voltage requirement. The reason is that the tunnel layer 12 has to be relatively thick for achieving a good retention time (typically, the retention time is desired to be in the order of years). Moreover, the blocking layer 14 adds to the complexity of the memory cell 10, and particularly to increased costs of manufacturing the conventional flash memory.

As a consequence of the tunnel layer 12, even with programming voltages as high as 20 V, for example, the programming time of the memory cell 10 is still in the order of 100 μs, which is extremely slow compared to the speed of current electronics (e.g. of a current central processing unit (CPU)). Therefore, the conventional flash memory cannot directly communicate with such a CPU, or with a microprocessor or microcontroller, and therefore intermediate memory levels are required. For instance, a memory hierarchy may be used for bridging this speed gap, wherein a DRAM connects to the CPU, and an SCM connects the DRAM and the flash memory.

If a flash memory device with higher speeds could be obtained, preferably also at lower programming voltages, then the flash memory could communicate directly with the DRAM, without the need for an intermediate SCM. Alternatively, such a high-speed memory device could be used as SCM in the above-mentioned memory hierarchy. Both approaches would significantly reduce the cost of the whole memory system.

SUMMARY OF CERTAIN INVENTIVE ASPECTS

The present disclosure and its embodiments are based further on the following considerations of the inventors. Generally, the inventors considered that including a ferroelectric layer in a flash memory cell may be beneficial for reducing the required programming voltage.

Moreover, because of the difficult voltage-retention trade-off, some 3D NAND type memories use a gate all around structure, which enhances the field in the tunnel layer by using the curvature of the memory hole. The density could even be doubled, if it would be possible to apply a trench architecture, as explained in U.S. Pat. No. 10,522,624 B2. This, however, may require new boosters to compensate for the loss of curvature. The inventors thus specifically considered that including a ferroelectric layer into the memory cell may enable such a trench architecture with double density after all.

Exemplary approaches of including a ferroelectric layer into a flash memory cell comprise: (a) using a ferroelectric blocking layer arranged on a conventional charge trapping layer; or (b) using an additional ferroelectric blocking layer arranged on a conventional blocking layer; or (c) using a ferroelectric trapping layer with a conventional blocking layer formed on top of it.

However, these exemplary approaches either do not overcome the above-mentioned problems related to the programming voltage of the flash memory device, or require a large number of layers that adds to the complexity and cost of (manufacturing) the memory device.

In view of the above, this disclosure has the objective to provide an improved memory cell for a memory device—for instance, for a flash memory device, an SCM device, or a DRAM device—wherein the memory cell can be programmed faster and with a lower programming voltage. Thereby, another objective of this disclosure is to introduce a ferroelectric layer into the memory cell in such a way, that it does not add to the complexity and manufacturing cost of the memory cell.

These and other objectives are achieved by the embodiments of this disclosure provided in the enclosed independent claims. Advantageous implementations of the embodiments are defined in the dependent claims.

In particular, the embodiments of this disclosure are based on a memory cell that includes a ferroelectric layer as a charge trapping layer (e.g., a ferroelectric trapping layer), and that does not include any blocking layer between the charge trapping layer and the gate (layer).

A first aspect of this disclosure provides a memory cell for a memory device, wherein the memory cell comprises a layer stack including: a semiconductor layer; a tunnel layer provided directly on the semiconductor layer; a ferroelectric trapping layer provided directly on the tunnel layer; and a conductive gate layer provided directly on the ferroelectric trapping layer.

The memory cell of the first aspect thus comprises a ferroelectric layer as a charge trapping layer. This reduces the programming voltage that is needed to program the memory cell, e.g., to effect tunneling of electrons from the semiconductor layer into the ferroelectric trapping layer, in which the electrons may be trapped. Further, the ferroelectric trapping layer allows omitting a blocking layer between the charge trapping layer and the gate layer, e.g., the gate layer is provided directly on the ferroelectric trapping layer, without any in between layer.

In particular, due to the ferroelectric trapping layer, a potential well can form at the interface between the ferroelectric trapping layer and the tunnel layer during the programming of the memory cell. Further, a force on trapped electrons in the ferroelectric trapping layer is directed towards the tunnel layer during the programming, and not towards the gate layer. Accordingly, the memory cell can have a sufficient retention time even without the use of a blocking layer between the ferroelectric trapping layer and the gate layer.

In an implementation of the memory cell, the ferroelectric trapping layer is configured and arranged such that its positively polarized side is in contact with the tunnel layer and its negatively polarized side is in contact with the conductive gate layer, if a positive voltage above a predetermined threshold voltage is applied to the conductive gate layer.

This favors the formation of the above-described potential well in the ferroelectric trapping layer at the tunnel layer interface.

In an implementation of the memory cell, the ferroelectric trapping layer comprises one or both of a hafnium oxide layer and a hafnium zirconium oxide layer.

In an implementation of the memory cell, the tunnel layer comprises one or both of a dielectric layer and an oxide layer.

In an implementation of the memory cell, the semiconductor layer comprises one or more of a silicon layer, a silicon-based layer, an oxide semiconductor, and an indium gallium zinc oxide.

In an implementation of the memory cell, the conductive gate layer comprises a metal layer or a titanium nitride layer.

In an implementation of the memory cell, the semiconductor layer comprises a semiconductor channel; the tunnel layer surrounds the semiconductor channel; the ferroelectric trapping layer surrounds the tunnel layer and the semiconductor channel; and the conductive gate layer surrounds the ferroelectric trapping layer, the tunnel layer, and the semiconductor channel.

Accordingly, a memory cell (or a string of multiple memory cells) having a gate all around structure may be realized.

A second aspect provides a memory device comprising a plurality of memory cells, wherein each of the plurality of memory cells is implemented according to the first aspect or any of its implementations described above.

Thus, a memory device may be realized, which has a sufficient retention time, while it also requires a lower programming voltage for its memory cell(s)—and thus enables higher programming speeds than a conventional flash memory.

In an implementation of the memory device, the plurality of memory cells are connected to each other and form a NAND string.

That is, a NAND type memory device may be realized, which may have one or more such NAND strings.

In an implementation, the memory device is a 3D memory device comprising a vertical semiconductor channel surrounded by a plurality of concentric layers materials. In this implementation, for each memory cell of the plurality of memory cells, the semiconductor layer comprises a semiconductor channel, e.g., a vertical semiconductor channel extending in a direction crossing the substrate, the tunnel layer surrounds the semiconductor channel, the ferroelectric trapping layer surrounds the tunnel layer and the semiconductor channel, and the conductive gate layer surrounds the ferroelectric trapping layer, the tunnel layer, and the semiconductor channel.

Accordingly, a 3D memory device, for example, a 3D NAND type memory device may be realized. Each of one or more NAND strings of such a 3D memory device may be implemented in a gate all around structure.

In an implementation, the memory device is a DRAM device or a SCM device or a flash memory device.

The memory device of the second aspect may replace a conventional flash memory device, or may act as a SCM device arranged between a conventional DRAM device and a conventional flash memory device (e.g., in a memory hierarchy as described above). The memory device of the second aspect may even replace a conventional DRAM device.

A third aspect of this disclosure provides a method for operating a memory cell of a memory device, where the memory cell is implemented according to the first aspect or any implementation thereof, wherein the method comprises: applying a positive voltage above a predetermined threshold voltage to the conductive gate layer, wherein the ferroelectric trapping layer switches its polarity such that its positively polarized side is formed in contact with the tunnel layer; and electrons are tunneled from the semiconductor layer through the tunnel layer into the ferroelectric trapping layer.

In this way the memory cell may be programmed, wherein a programming voltage can be much lower than in a conventional (flash) memory device, due to the ferroelectric trapping layer.

In an implementation of the third aspect, at least a part of the electrons, which are tunneled from the semiconductor layer through the tunnel layer into the ferroelectric trapping layer, are trapped in defects of the ferroelectric trapping layer and/or are captured in a potential well formed at an interface of the tunnel layer and the ferroelectric trapping layer.

Thus, the retention time of the memory cell is sufficiently high, even though the memory cell does not have the blocking layer of the conventional memory cell shown in FIGS. 1A and 1B.

In an implementation of the third aspect, the method further comprises applying a voltage below the predetermined threshold voltage to the conductive gate layer, wherein the ferroelectric layer switches its polarity such that its negatively polarized side is formed in contact with the tunnel layer; and the trapped electrons in the ferroelectric trapping layer are tunneled from the ferroelectric trapping layer through the tunnel layer into the semiconductor layer.

In particular, applying the voltage below the predetermined threshold voltage may comprise applying the voltage below another predetermined negative threshold voltage. In this way the memory cell can be erased. Thereby, the erasing voltage may be lower in absolute value than in a conventional (flash) memory device.

A fourth aspect of this disclosure provides a method for fabricating a memory cell for a memory device, wherein the method comprises: forming a semiconductor layer; forming tunnel layer directly on the semiconductor layer; forming a ferroelectric trapping layer directly on the tunnel layer; and forming a conductive gate layer directly on the ferroelectric trapping layer.

The method of the fourth aspect may produce the memory cell of the first aspect and any implementation thereof, and further the memory device of the second aspect. The method of the fourth aspect achieves the same advantages as the memory cell and memory device of the first and second aspect, respectively, and may be extended by respective implementations as described above for the memory device of the first aspect.

BRIEF DESCRIPTION OF THE DRAWINGS

The above described aspects and implementations are explained in the following description of embodiments with respect to the enclosed drawings.

DETAILED DESCRIPTION OF CERTAIN ILLUSTRATIVE EMBODIMENTS

Figure 2:
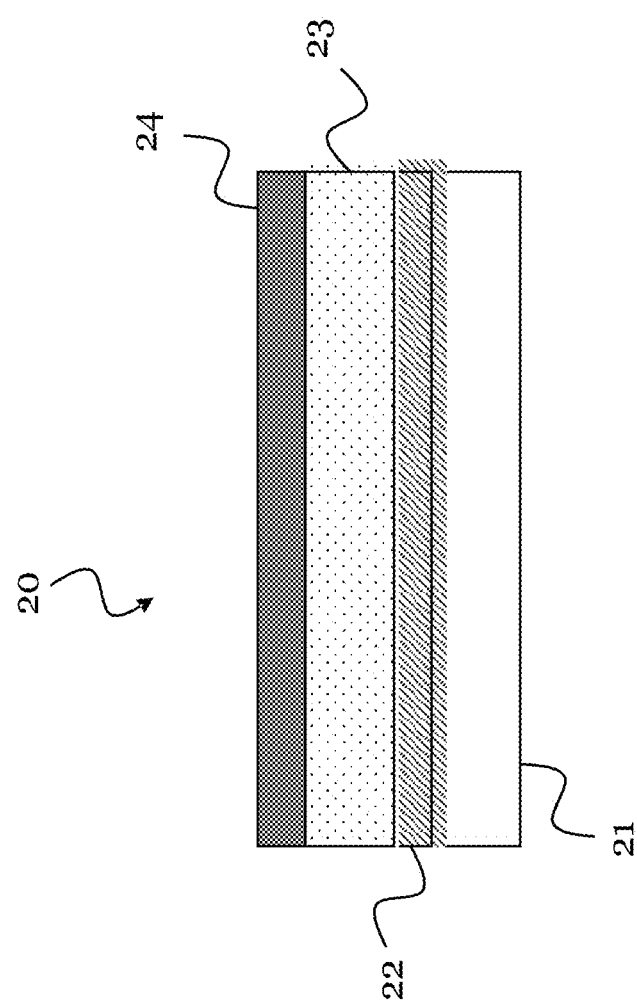
FIG. 2 shows a memory cell according to an embodiment of this disclosure including multiple layers.

FIG. 2 shows schematically a memory cell 20 according to an embodiment of this disclosure. The memory cell 20 may be a memory cell of a memory device according to another embodiment. This memory device may include a plurality of such memory cells 20. The memory device may, in particular, be a NAND type memory device, e.g., in which multiple memory cells 20 may be connected to each other in at least one NAND string. The memory device may be a three-dimensional (3D) memory device, wherein one or more NAND strings may be formed in a gate all around structure. The memory device may, for example, be a DRAM device, a SCM device, or a flash memory device, and the memory cell 20 is suitable for any such memory device.

As shown in FIG. 2, the memory cell 20 includes a semiconductor layer 21, which for instance, comprises a silicon layer, or a silicon-based layer, or a semiconductor-oxide layer. Further, the memory cell 20 includes a tunnel layer 22, which is arranged directly on the semiconductor layer 21. The tunnel layer 22 may comprise an oxide layer, like a silicon oxide layer. Further, the memory cell 20 includes a ferroelectric trapping layer 23, which is arranged directly on the tunnel layer 22. Finally, it includes a conductive gate layer 24 that is arranged directly on the ferroelectric trapping layer 23. The ferroelectric trapping layer 23 may comprise one or both of a hafnium oxide layer and a hafnium zirconium oxide layer. The gate layer 24 may comprise a metal layer, like a titanium nitride layer, and may be formed as a metal gate structure. The layers 21, 22, 23, 24 of the memory cell 20 form a layer stack of the memory cell 20. Notably, of the layers 21, 22, 23, 24, the conductive gate layer 24 may be formed first, and the semiconductor layer 21 may be formed last, as described below.

Figure 3B:
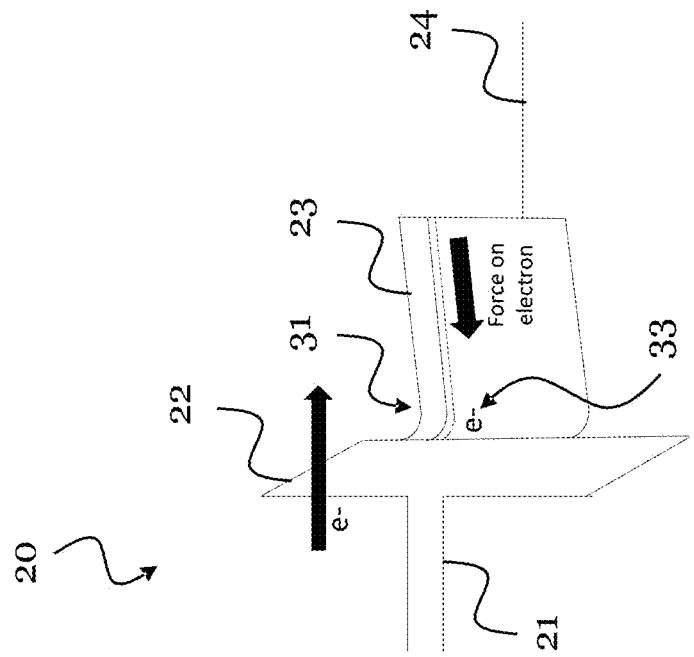
FIGS. 3A and 3B show band-diagrams of a memory cell according to an embodiment of this disclosure, during the programming of the memory cell.
Figure 3A:
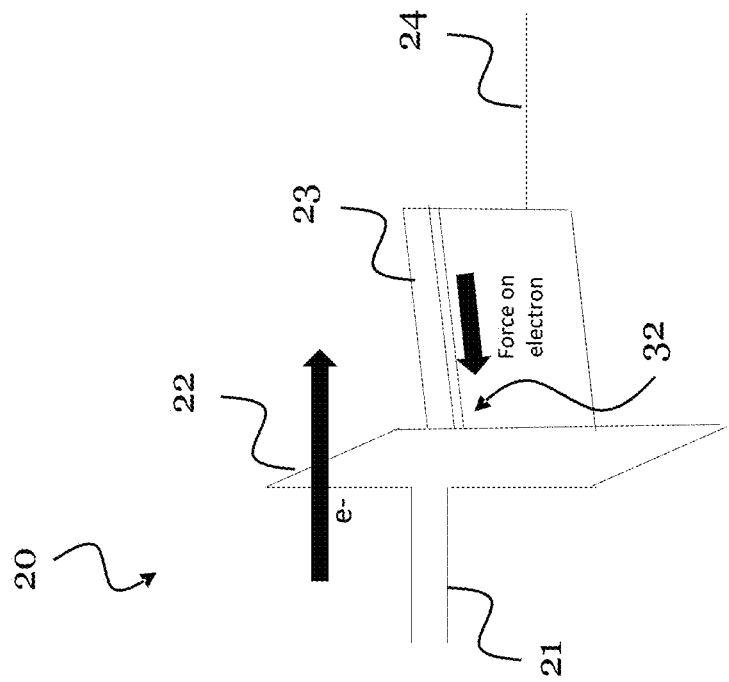

FIGS. 3A and 3B show schematically band-diagrams of the memory cell 20 shown in FIG. 2, in operation. Same layers of the memory cell 20 are labelled with the same reference signs in FIG. 2 and in FIGS. 3A and 3B. In particular—similar as shown for the memory cell 10 in FIGS. 1A and 1B—FIG. 3A shows a start of programming the memory cell 20, and FIG. 3B shows an end of programming the memory cell 20.

Figure 1A:
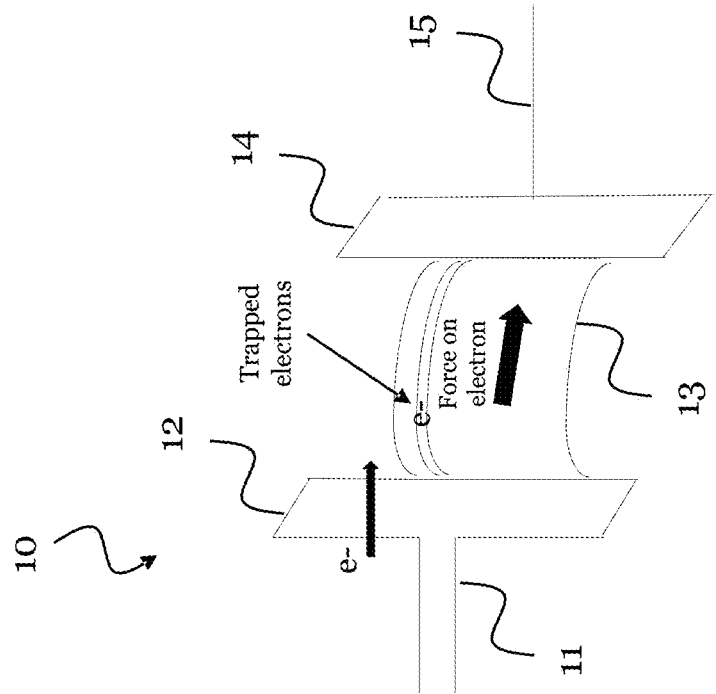
FIGS. 1A and 1B show band diagrams of a memory cell of a conventional flash memory during the programming of the memory cell.

At the start of the programming of the memory cell 20, the band diagram is similar to the band diagram of the memory cell 10 of the conventional flash memory shown in FIG. 1A (of course, in FIG. 3A there is no blocking layer between the ferroelectric charge trapping layer 23 and the conductive gate layer 24). When the ferroelectric trapping layer 23 switches polarity upon applying the programming pulse (e.g., applying a positive voltage above a predetermined threshold voltage to the conductive gate layer 24), the electric field in the trapping layer 23 may reverse. In particular, the ferroelectric trapping layer 23 may be arranged such that its positively polarized side is in contact with the tunnel layer 22, and its negatively polarized side is in contact with the conductive gate layer 24, when the programming voltage is applied to the conductive gate layer 24. As a consequence, a large field drops over the tunnel layer 22, and further a much lower programming voltage is used compared to the conventional flash memory shown in FIGS. 1A and 1B. Because of the electric field reversal, the electrons that tunnel through the tunnel layer 22 into the ferroelectric trapping layer 23 may moreover be trapped predominantly at an interface region 32 between the layer 23 and the tunnel layer 22 (which may lead to larger threshold voltage (Vth) shift for the same charge).

Towards the end of programming the memory cell 20, the electron injection is lower, and the trapped electrons cause a band bending 31, however, at the interface region 32 between the charge trapping layer 23 and the tunnel layer 22. This keeps the force on the electrons directed towards this interface (rather than being directed towards the conductive gate layer 24). As a consequence, no blocking layer may be needed between the trapping layer 23 and the gate layer 24 (e.g., it may not be necessarily required for achieving sufficient retention time), and can be omitted in some implementations. Of course, a blocking layer, like an oxide layer, could still be added to the memory cell 20 between the ferroelectric charge trapping layer 23 and the conductive gate layer 24, in order to increase the retention of the memory cell 20 further. However, without the blocking layer, the complexity of the memory cell 20 is lower, which can be preferable.

In the following, some more details and explanations are given regarding the memory cell 20 shown in FIG. 2 and FIGS. 3A and 3B, respectively. The ferroelectric trapping layer 23 can be used for the purpose of electron trapping, since some ferroelectric materials contain defects that are suitable for electron trapping (e.g., doped hafnium oxide and hafnium zirconium oxide containing dopant sites serving as trapping sites are particularly suitable ferroelectric materials for this purpose). Further, the ferroelectric trapping layer 23 has a permanent dipole, which changes the internal field inside the trapping layer 23. This field can be oriented against the applied voltage, e.g., against the programming voltage applied to the memory cell during programming, because of the substantial size of the dipole of the ferroelectric trapping layer 23. Since moreover the ferroelectric trapping layer 23 is in contact with the tunnel layer 22, the voltage drop over the tunnel layer 22 may change drastically when the ferroelectric trapping layer 23 switches its polarity upon applying the programming voltage.

Figure 1B:
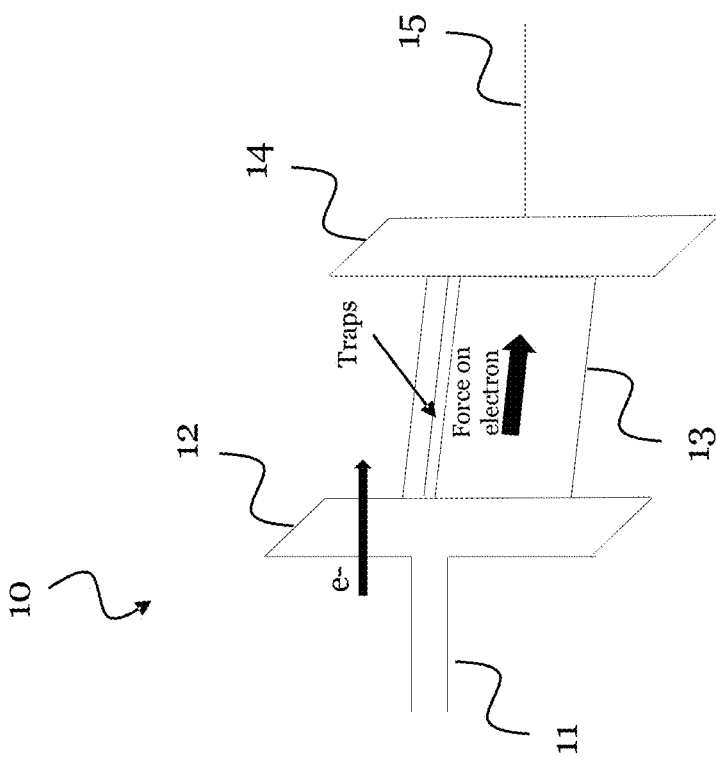

Another advantage of the ferroelectric field of the ferroelectric trapping layer 23 being oriented against the tunnel layer field during the programming of the memory cell 20 is that the electrons in the charge trapping layer 23 will be pushed back into an area near the tunnel layer-ferroelectric interface (see FIGS. 3A and 3B). This ensures a large window, since the trapped electrons are preferentially close to the semiconductor layer 21, and since they are not uniformly distributed inside the ferroelectric trapping layer 23. Further, this ensures a good retention of the memory cell 20, since no force drives the electrons out of the ferroelectric trapping layer 23—in contrast to what is shown in FIGS. 1A and 1B. The good retention allows skipping the blocking layer, which is typically needed in conventional flash memory devices (see the blocking layer 14 in FIGS. 1A and 1B).

As a result, the equivalent oxide thickness (EOT) of the layer stack of the memory cell 20 is drastically smaller (also considering the intrinsically high dielectric constant of ferroelectrics), which may further help to scale even further a memory device that includes one or more such memory cell(s) 20 (e.g., in a 3D NAND where the stack thickness is in the pitch twice), and may also increase the read current, which helps for faster access times.

All these benefits of the memory cell 20 shown in FIGS. 2, 3A, and 3B, respectively, allow for a memory device which is faster (in read as well as in write) without sacrificing density (on the contrary). Therefore, the memory device may replace a flash memory and/or may also serve as a SCM between a conventional flash memory and a DRAM. Also, the write pulse (e.g., the programming voltage pulse) may be much smaller in amplitude, which enables to provide more bandwidth but also at lower cost, since the high voltage circuitry may be designed substantially smaller. Notably, the memory cell 20 proposed by this disclosure is backwards compatible with the currently used 3D NAND flows.

Figure 4:
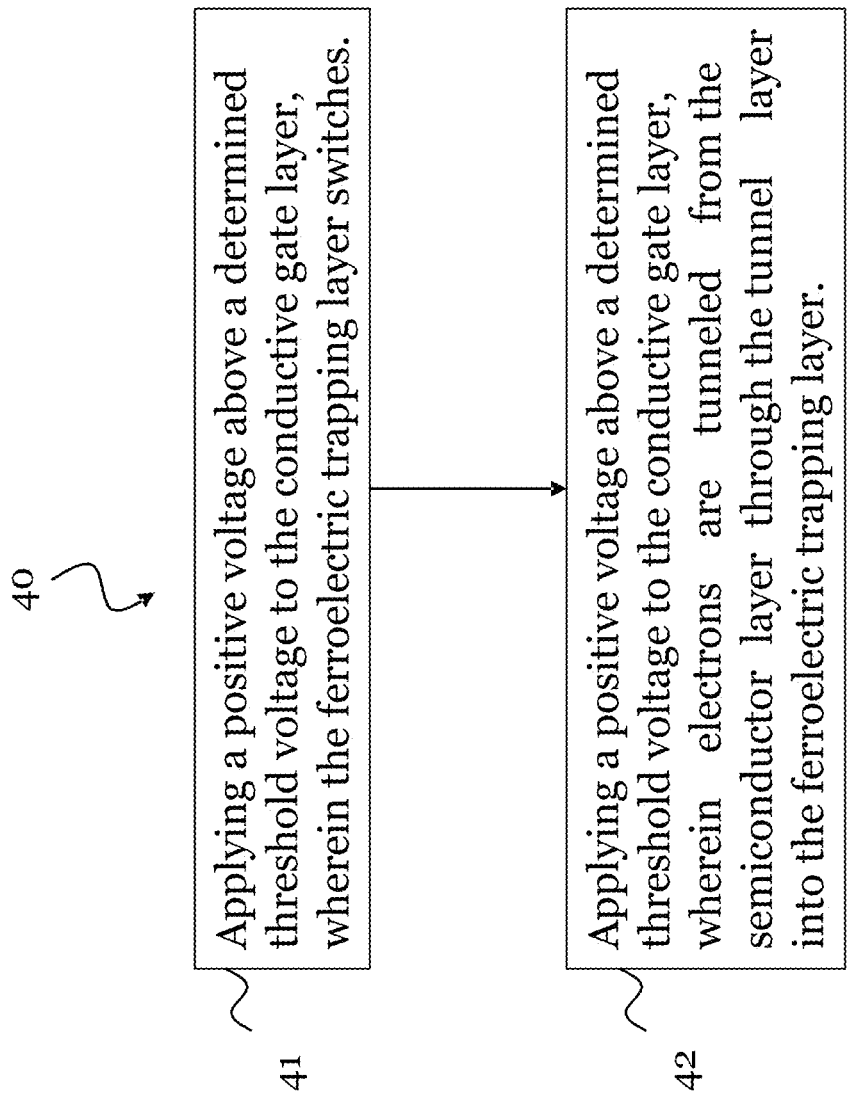
FIG. 4 shows a flow diagram of a method for operating a memory cell according to an embodiment of this disclosure.

FIG. 4 shows a method 40 according to an embodiment of this disclosure. The method 40 is for operating a memory cell of a memory device. The memory cell 20 may be implemented as shown in FIGS. 2, 3A, and 3B, e.g., based on the same layer stack including layers 21, 22, 23, 24.

The method 40 comprises—for programming the memory cell—a step 41 of applying a positive voltage above a predetermined threshold voltage to the conductive gate layer 24, wherein the ferroelectric trapping layer 23 switches its polarity such that its positively polarized side is formed in contact with the tunnel layer. Further, the method 40 comprises a step 42 of (still) applying a positive voltage above a predetermined threshold voltage to the conductive gate layer 24, wherein electrons are tunneled from the semiconductor layer 21 through the tunnel layer 22 into the ferroelectric trapping layer 23. These steps resemble the scenario shown in FIGS. 3A and 3B.

Further, the method 40 may comprise—for erasing the memory cell—a step of applying a voltage below the predetermined threshold voltage to the conductive gate layer 24. In this case, the ferroelectric layer 23 switches again its polarity, such that its negatively polarized side is formed in contact with the tunnel layer 22. This leads to the trapped electrons 33 in the ferroelectric trapping layer 23 tunneling from the ferroelectric trapping layer 23 through the tunnel layer 22 into the semiconductor layer 21.

That is, for the erasing, a similar effect can be used to remove the electrons and eventually trap holes in the ferroelectric trapping layer 23 (the ferroelectric dipole flips back to enhance the tunnel oxide field in the other direction).

Figure 5:
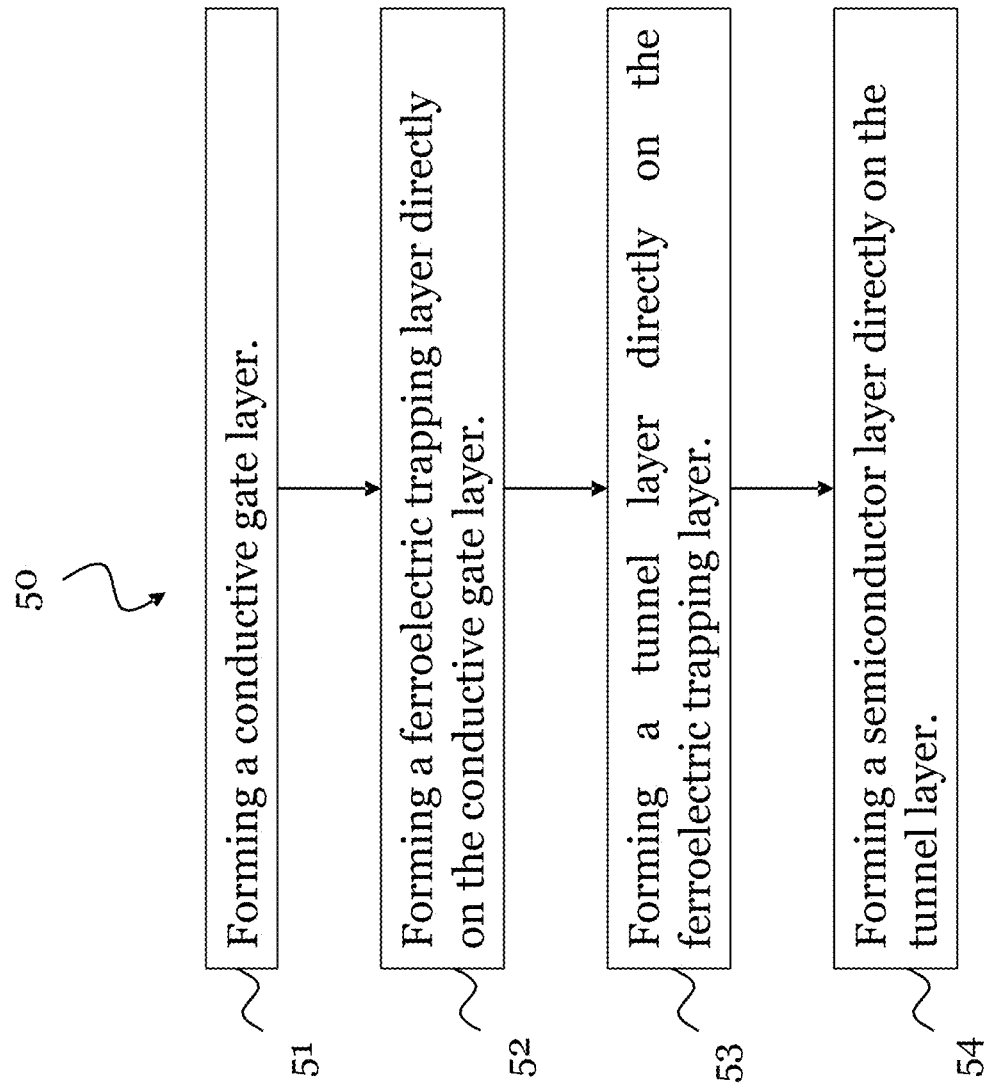
FIG. 5 shows a flow diagram of a method for fabricating a memory cell according to an embodiment of this disclosure.

FIG. 5 shows a method 50 according to an embodiment of this disclosure. The method 50 is for fabricating a memory cell 20 of a memory device. The memory cell 20 may be the one shown in FIGS. 2, 3A, and 3B, e.g., may be based on the layer stack.

The method 50 comprises a step 51 of forming the conductive gate layer 24. Then, the method 50 comprises a step 52 of forming the ferroelectric trapping layer 23 directly on the conductive gate layer 24, a step 53 of forming the tunnel layer 22 directly on the ferroelectric trapping layer 23, and finally a step 54 of forming the semiconductor layer 21 directly on the tunnel layer 22. The memory cell 20 may accordingly be fabricated in a channel-last approach (semiconductor layer 21 acting as channel), in particular, if the memory cell 20 has a gate all around structure. For example, after the conductive gate layer 24 is formed, a hole or trench may be formed in the conductive gate layer 24. Then, after the hole or trench is made in the conductive gate layer 24, the remaining layers 23, 22, 12 are formed in the hole or trench from the conductive gate layer 24 towards the semiconductor layer 21. Thus, the memory cell 20 may be built up sideways in the hole or trench.

The method 50 may alternatively comprise first a step of forming the semiconductor layer 21. In this case, the method 50 may further comprise a step of forming the tunnel layer 22 directly on the semiconductor layer 21, a step 53 of forming the ferroelectric trapping layer 23 directly on the tunnel layer 22, and finally a step of forming 54 the conductive gate layer 24 directly on the ferroelectric trapping layer 23.

The individual layers 21, 22, 23, 24 may in each alternative of the method 50 be formed by chemical vapor deposition and/or by atomic layer deposition. However, also an epitaxial growth or another deposition techniques may be used to form the individual layers 21, 22, 23, 24 of the memory cell 20.

In summary, this disclosure exploits the trapping capability of a metal-ferroelectric-interface-semiconductor stack, to propose a much more efficient stack with lower operating voltages and better electrical characteristics (read/write speed).

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number, respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The various features and processes described above may be implemented independently of one another, or may be combined in various ways. All possible combinations and subcombinations of features of this disclosure are intended to fall within the scope of this disclosure.

What is claimed is:

1. A memory cell for a three-dimensional memory device, wherein the memory cell comprises a layer stack including:
   a semiconductor channel;
   a tunnel layer provided directly on the semiconductor channel, wherein the tunnel layer surrounds the semiconductor channel;
   a ferroelectric trapping layer provided directly on the tunnel layer, wherein the ferroelectric trapping layer surrounds the tunnel layer and the semiconductor channel; and
   a conductive gate layer provided directly on the ferroelectric trapping layer, wherein the conductive gate layer surrounds the ferroelectric trapping layer, the tunnel layer, and the semiconductor channel.

2. The memory cell according to claim 1, wherein the ferroelectric trapping layer is configured and arranged such that a positively polarized side thereof is in contact with the tunnel layer and a negatively polarized side thereof is in contact with the conductive gate layer, when a positive voltage above a predetermined threshold voltage is applied to the conductive gate layer.

3. The memory cell according to claim 2, wherein the ferroelectric trapping layer comprises a doped ferroelectric material comprising defects serving as charge trapping sites.

4. The memory cell according to claim 1, wherein the ferroelectric trapping layer comprises one or both of a hafnium oxide layer and a hafnium zirconium oxide layer.

5. The memory cell according to claim 4,
   wherein the tunnel layer comprises a dielectric layer or an oxide layer, and
   wherein the semiconductor channel comprises one or more of a silicon layer, a silicon-based layer, an oxide semiconductor layer, and an indium gallium zinc oxide layer.

6. The memory cell according to claim 1, wherein the tunnel layer comprises a dielectric layer or an oxide layer.

7. The memory cell according to claim 1, wherein the semiconductor channel comprises one or more of a silicon layer, a silicon-based layer, an oxide semiconductor, and an indium gallium zinc oxide.

8. The memory cell according to claim 1, wherein the conductive gate layer comprises a metal layer or a titanium nitride layer.

9. The memory cell according to claim 1, wherein the ferroelectric trapping layer comprises a hafnium oxide layer.

10. The memory cell according to claim 9, wherein the conductive gate layer comprises a metal layer or a titanium nitride layer.

11. The memory cell according to claim 10, wherein the semiconductor channel comprises one or more of a silicon layer, silicon-based layer, an oxide semiconductor, and an indium gallium zinc oxide.

12. A method for fabricating the memory cell of claim 1, wherein the method comprises:
   forming the layer stack including:
      forming the semiconductor channel;
      depositing the tunnel layer directly on the semiconductor channel;
      depositing the ferroelectric trapping layer directly on the tunnel layer; and
      depositing the conductive gate layer directly on the ferroelectric trapping layer.

13. A three-dimensional memory device comprising a plurality of memory cells, wherein each of the plurality of memory cells comprises:
   a semiconductor channel;
   a tunnel layer provided directly on the semiconductor channel, wherein the tunnel layer surrounds the semiconductor channel;
   a ferroelectric trapping layer provided directly on the tunnel layer, wherein the ferroelectric trapping layer surrounds the tunnel layer and the semiconductor channel; and
   a conductive gate layer provided directly on the ferroelectric trapping layer, wherein the conductive gate layer surrounds the ferroelectric trapping layer, the tunnel layer, and the semiconductor channel.

14. The memory device according to claim 13, wherein the plurality of memory cells are connected to each other and form a NAND string.

15. The three-dimensional memory device according to claim 13, wherein the three-dimensional memory device is a dynamic random access memory device, or a storage class memory device.

16. A method of operating a memory cell of a memory device, wherein the method comprises:
   applying a positive voltage above a predetermined threshold voltage to a conductive gate layer, thereby causing:
      a ferroelectric trapping layer to switch a polarity such that a positively polarized side thereof is formed in contact with a tunnel layer, and electrons to tunnel from a semiconductor layer through the tunnel layer into the ferroelectric trapping layer.

17. The method according to claim 16, wherein at least a part of the electrons, which are tunneled from the semiconductor layer through the tunnel layer into the ferroelectric trapping layer, are trapped in defects of the ferroelectric trapping layer and/or are captured in a potential well formed at an interface of the tunnel layer and the ferroelectric trapping layer.

18. The method according to claim 17, further comprising:
   applying a voltage below the predetermined threshold voltage to the conductive gate layer, thereby causing:
      the ferroelectric layer to switch a polarity such that a negatively polarized side thereof is formed in contact with the tunnel layer, and
      the trapped electrons in the ferroelectric trapping layer tunnel from the ferroelectric trapping layer through the tunnel layer into the semiconductor layer.

* * * * *